(12) United States Patent
Sugai et al.

(10) Patent No.: US 8,457,167 B2
(45) Date of Patent: Jun. 4, 2013

(54) SEMICONDUCTOR LASER DEVICE AND METHOD OF MANUFACTURING THE SAME

(75) Inventors: Maki Sugai, Tokyo (JP); Shinji Saito, Kanagawa (JP); Rei Hashimoto, Tokyo (JP); Yasushi Hattori, Kanagawa (JP); Jongil Hwang, Kanagawa (JP); Masaki Tohyama, Kanagawa (JP); Shinya Nunoue, Chiba (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/873,821

(22) Filed: Sep. 1, 2010

(65) Prior Publication Data

US 2011/0216798 A1 Sep. 8, 2011

(30) Foreign Application Priority Data

Mar. 8, 2010 (JP) .................. 2010-050178

(51) Int. Cl.
*H01S 5/00* (2006.01)
(52) U.S. Cl.
USPC .................. 372/46.012; 372/43.01; 372/46.01
(58) Field of Classification Search
USPC ..................................... 372/46.012
See application file for complete search history.

(56) References Cited

U.S. PATENT DOCUMENTS

| | | | |
|---|---|---|---|
| 4,236,296 A * | 12/1980 | Woolhouse et al. | 438/33 |
| 5,111,466 A * | 5/1992 | Normandin et al. | 372/22 |
| 6,278,173 B1 | 8/2001 | Kobayashi et al. | |
| 6,303,405 B1 | 10/2001 | Yoshida et al. | |
| 2002/0074556 A1 * | 6/2002 | Kwak et al. | 257/79 |
| 2003/0147440 A1 * | 8/2003 | Nomura et al. | 372/46 |
| 2008/0006838 A1 | 1/2008 | Hattori et al. | |

FOREIGN PATENT DOCUMENTS

| | | |
|---|---|---|
| JP | 63-195768 U | 12/1988 |
| JP | 11-251265 | 9/1999 |
| JP | 2002-158393 | 5/2002 |
| JP | 2004-140203 | 5/2004 |
| JP | 2007-158008 | 6/2007 |
| JP | 2009-200332 | 9/2009 |

OTHER PUBLICATIONS

Office Action issued Mar. 21, 2012, in Japanese Patent Application No. 2010-050178 with English translation.
Office Action issued Nov. 6, 2012, in Japanese Patent Application No. 2010-050178, filed Mar. 8, 2010 (with English-language Translation).

* cited by examiner

*Primary Examiner* — Xinning Niu
(74) *Attorney, Agent, or Firm* — Oblon, Spivak, McClelland, Maier & Neustadt, L.L.P.

(57) ABSTRACT

Embodiments describe a semiconductor laser device driven at low voltage and which is excellent for cleavage and a method of manufacturing the device. In one embodiment, the semiconductor laser device includes a GaN substrate; a semiconductor layer formed on the GaN substrate; a ridge formed in the semiconductor layer; a recess formed in the bottom surface of the GaN substrate. The recess has a depth less than the thickness of the GaN substrate. The device also has a notch deeper than the recess formed on a side surface of the GaN substrate and separated from the recess. In the semiconductor laser device, the total thickness of the GaN substrate and the semiconductor layer is 100 μm or more, and the distance between the top surface of the ridge and the bottom surface of the recess is 5 μm or more and 50 μm or less.

8 Claims, 13 Drawing Sheets

AA SECTION

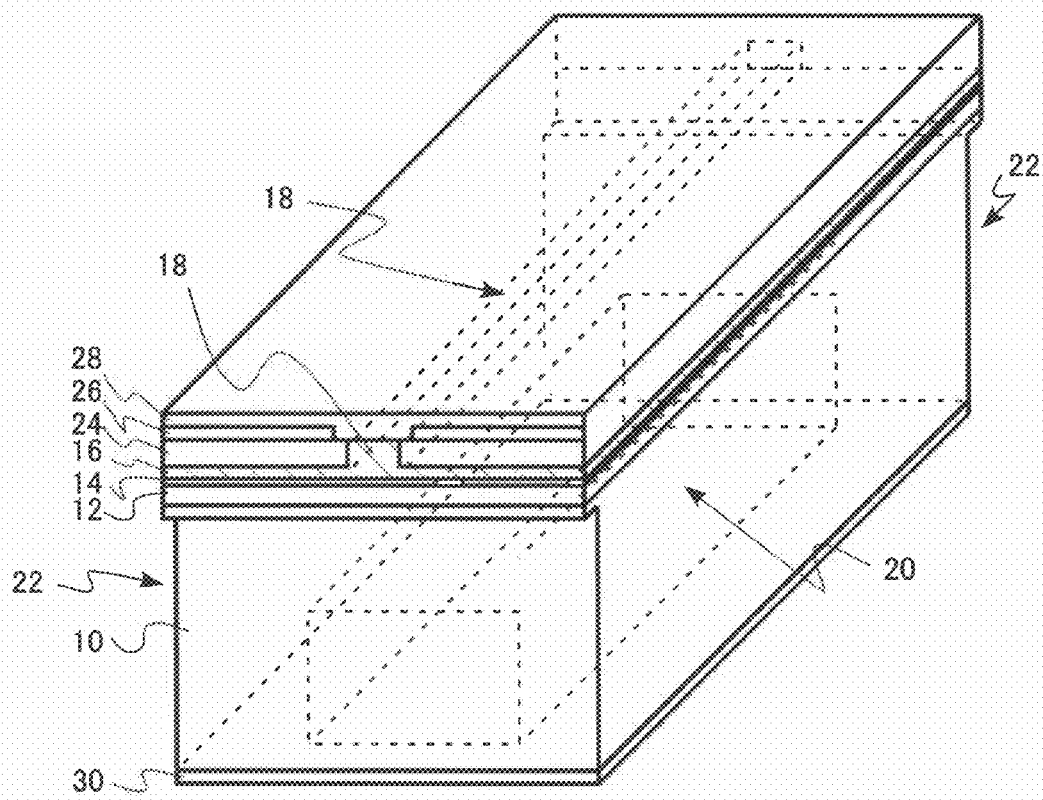

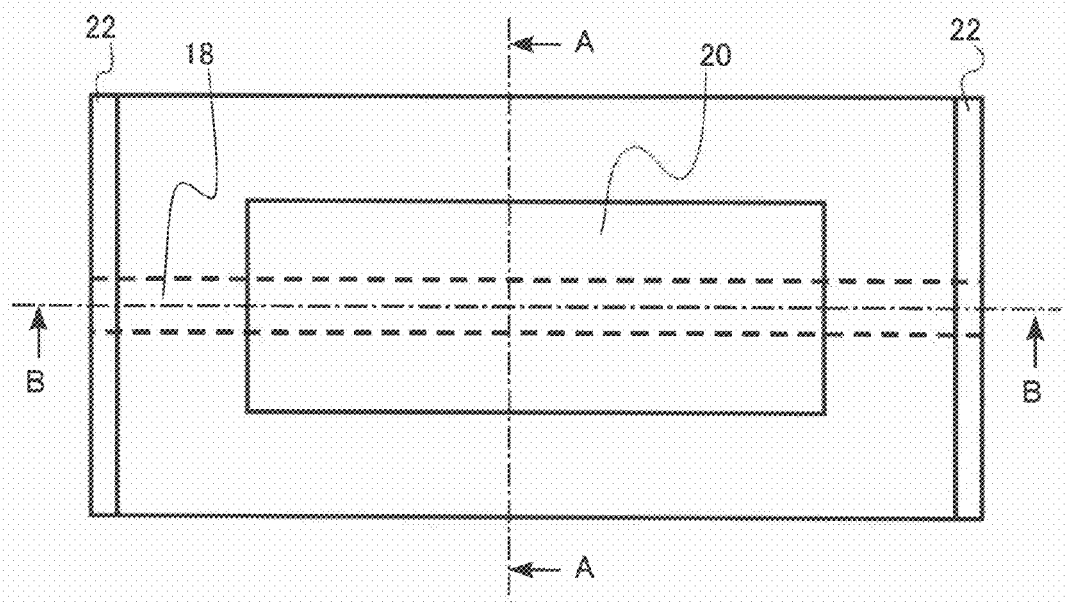

AA SECTION

BB SECTION

EMBODIMENT : 5.54V@500mA

CONVENTIONAL STRUCTURE : 5.74V@500mA

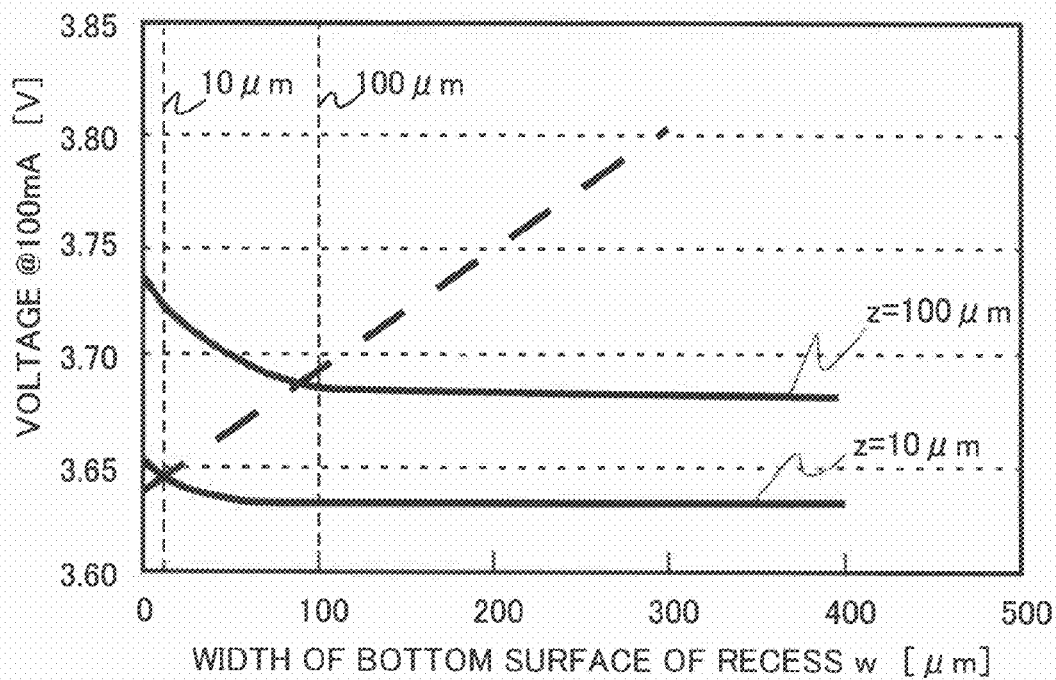

AA SECTION

BB SECTION

AA SECTION

BB SECTION

AA SECTION

BB SECTION

AA SECTION

BB SECTION

AA SECTION

BB SECTION

SEMICONDUCTOR LASER DEVICE AND METHOD OF MANUFACTURING THE SAME

CROSS-REFERENCE TO RELATED APPLICATION

This application is based upon and claims the benefit of priority from Japanese Patent Application No. 2010-050178, filed on Mar. 8, 2010, the entire contents of which are incorporated herein by reference.

FIELD

Embodiments described herein relate generally to a semiconductor laser device.

BACKGROUND

In recent years, semiconductor lasers have been used in various fields, such as house hold electrical products, office automation equipment, communication devices and industrial measuring instruments. Efforts are focused on developing short wavelength semiconductor lasers, among semiconductor lasers, for the purpose of applying them to high density optical disk recording, laser display and the like expected to be used in many fields.

In particular, regarding GaN-based semiconductor lasers, the wavelength can be shortened up to 350 nm or less, and the laser oscillation operation in 400 nm is reported. In terms of reliability of the material, a reliability for 10,000 hours or more of a light emitting diode (LED) is confirmed. The GaN-based semiconductor lasers have possibilities of oscillation in a wide wavelength range, and therefore are preferable for the application to laser displays and the like.

However, in consideration of the application to laser displays and the like, high power is required for driving. For this reason, it is desirable in view of power consumption to obtain semiconductor lasers with low operation voltage. In self standing semiconductor lasers, for example, an interface between the back surface of the GaN substrate and an electrode is mentioned as a portion having a high resistance. Such a high resistance portion makes it difficult to reduce the operation voltage.

There is proposed a technique to process the back surface of the substrate of a GaN-based semiconductor laser to be in an irregular shape to achieve an electrode with low contact resistance. There is also proposed a semiconductor laser in which cleavage assistant grooves are provided in a sapphire substrate to improve the cleavage property.

BRIEF DESCRIPTION OF THE DRAWINGS

FIG. 1 is a schematic perspective view of a semiconductor laser device of a first embodiment.

FIG. 2 is a plan view of the bottom surface of the semiconductor laser device of the first embodiment.

FIG. 7 shows the relationships between the voltage and the width of the bottom surface of the recess of the semiconductor laser device of the first embodiment.

DETAILED DESCRIPTION

Figure 3A:
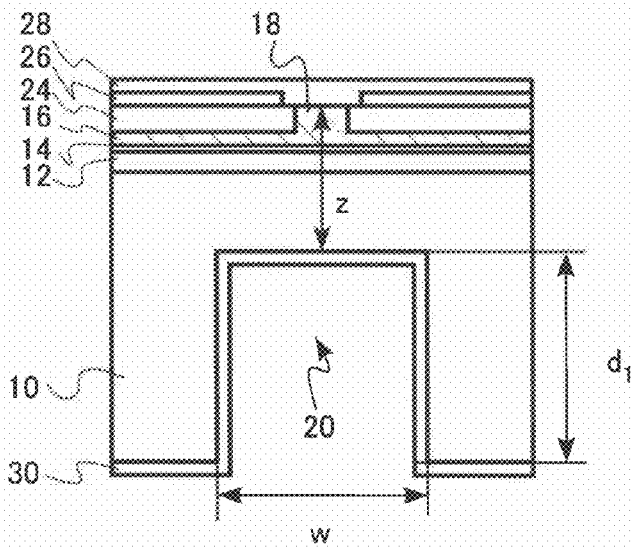
FIGS. 3A and 3B are schematic sectional views of the semiconductor device of the first embodiment.

Embodiments describe semiconductor laser device driven at low voltage and which is excellent for cleavage and a method of manufacturing the device. In one embodiment, the semiconductor laser device includes a GaN substrate; a semiconductor layer formed on the GaN substrate; a ridge formed in the semiconductor layer; a recess formed in the bottom surface of the GaN substrate. The recess has a depth less than the thickness of the GaN substrate. The device also has a notch deeper than the recess formed on a side surface of the GaN substrate and separated from the recess. In the semiconductor laser device, the total thickness of the GaN substrate and the semiconductor layer is 100 µm or more, and the distance between the top surface of the ridge and the bottom surface of the recess is 5 µm or more and 50 µm or less. Embodiments will be described below with reference to the accompanying drawings. The same or similar parts are denoted by the same or similar reference characters in the following description of the drawings.

A part in the direction toward a ridge with reference to a GaN substrate is referred to herein for convenience as a "top" part or an "upper" part, and the upper surface of a substrate, a semiconductor layer or the like is referred to as a "top surface". A part in the direction opposite to the above direction is referred to as a "bottom" part or a "lower" part, and the lower surface of the substrate, the semiconductor layer or the like is referred to as a "bottom surface". Accordingly, "top" and "bottom" as used herein do not necessarily correspond to the top and the bottom in the vertical direction, or the top and the bottom in the drawings.

First Embodiment

A semiconductor laser device of this embodiment includes a GaN substrate, a semiconductor layer formed on the top surface of the GaN substrate, and a ridge formed in the top of the semiconductor layer. The semiconductor laser device further includes a recess which is formed in the bottom surface of the GaN substrate and which has a depth less than the thickness of the GaN substrate; a notch which is deeper than the recess and which is formed in a portion adjacent to the bottom surface of the GaN substrate on a side surface intersecting with the direction of extension of the ridge of the GaN substrate so as to be separated from the recess by the GaN substrate; a first electrode formed on the top surface of the ridge; and a second electrode formed on the bottom surface of the recess. The total thickness of the GaN substrate and the semiconductor layer is 100 μm or more, and the distance (first distance) between the top surface of the ridge and the bottom surface of the recess is 5 μm or more and 50 μm or less.

In the semiconductor laser device of this embodiment, the second electrode is provided in the recess obtained by digging a portion directly under the ridge of the GaN substrate from the bottom surface side thereof. This structure decreases the resistance of a portion corresponding to the GaN substrate to achieve reduction in operation voltage. The notch which is deeper than the recess is provided in the side surface of the GaN substrate. This structure enables cleavage to be performed with good accuracy during manufacturing processes for forming mirror surfaces of end surfaces of a resonator even when a mechanically weak recess is provided in the bottom surface of the GaN substrate.

The semiconductor laser device of this embodiment is, for example, a ridge-waveguide blue-violet semiconductor laser using an InGaN layer as an active layer, which functions as a light emitting portion.

Figure 3B:
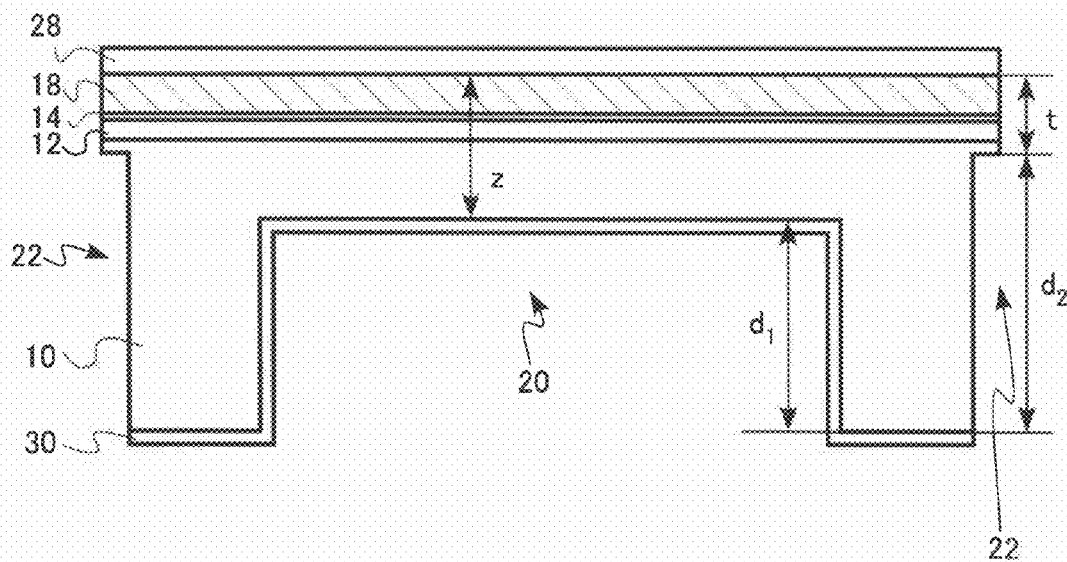

FIG. 1 is a schematic perspective view of a semiconductor laser device of this embodiment. FIG. 2 is a plan view of the bottom surface of the semiconductor laser device of this embodiment. FIGS. 3A and 3B are schematic sectional views of the semiconductor device of this embodiment. FIG. 3A is a sectional view taken along the line A-A of FIG. 2, and FIG. 3B is a sectional view taken along the line B-B of FIG. 2. The chip size of this semiconductor laser device is obtained by "the chip size in the direction of A-A"ב"the chip size in the direction of B-B", for example, 400 μm×600 μm.

The semiconductor laser device of this embodiment includes a GaN substrate 10, and, as the semiconductor layer formed on the top surface of the GaN substrate 10, an n-type semiconductor layer 12, an active layer 14 formed on the n-type semiconductor layer 12, and a p-type semiconductor layer 16 formed on the active layer 14.

The n-type semiconductor layer 12 has a stacked structure in which, for example, an n-type GaN buffer layer, an n-type AlGaN clad layer and an n-type GaN guide layer are formed in this order from the layer adjacent to the GaN substrate 10. The active layer 14 functioning as a light emitting portion is formed in a stacked structure of, for example, a well layer and a barrier layer. For example, InGaN layers with varying concentrations of In are used for the well layer and the barrier layer. The p-type semiconductor layer 16 has a stacked structure in which, for example, an i-type GaN guide layer, a barrier layer, a p-type GaN guide layer, a p-type AlGaN clad layer and a p-type GaN contact layer are formed in this order from the layer adjacent to the active layer 14.

In the top of the p-type semiconductor layer 16, a ridge 18 is formed by digging into the p-type semiconductor layer 16. The ridge 18 extends linearly from one side surface to the other side surface of the semiconductor laser device.

In an area, which is directly under the ridge 18, of the bottom surface of the GaN substrate 10, a recess 20 is formed along the direction of extension of the ridge 18. That is, the recess 20 is disposed such that when the ridge 18 is projected in a direction normal to the top surface or the bottom surface of the GaN substrate 10 onto the side of the GaN substrate 10, at least part of the projection overlaps the recess 20. The longitudinal direction of the recess 20 is given to correspond to the direction of extension of the ridge 18, that is, the resonance direction of the semiconductor laser device. Here, for example, the length in the direction of extension of the ridge 18, that is, the length of the resonator is 600 μm.

The depth of the recess 20 is less than the thickness of the GaN substrate 10. That is, the device is configured such that the distance corresponding to "$d_1$" in FIGS. 3A and 3B is smaller than the thickness of the GaN substrate 10.

Further, notches 22, which are deeper than the recess 20, are formed in portions adjacent to the GaN substrate 10 on side surfaces intersecting with the direction of extension of the ridge 18 of the GaN substrate 10. That is, the device is configured such that the distance corresponding to "$d_2$" in FIG. 3B is larger than the distance corresponding to "$d_1$". The notches 22 are formed to be separated from the recess 20 by the GaN substrate 10. In this way, the notches 22 are formed so as not to intersect with the recess 20, which reduces adverse effects on the recess 20 during cleavage in the manufacturing process.

The buried layers 24 of an insulator of a metal oxide having a relatively small membrane stress, such as $SiO_2$ or $ZrO_2$ (zirconium dioxide), are formed in grooves on both sides of the ridge 18. A protective layer 26, for example, of $SiO_2$ is formed on the buried layer 24. The protective layer 26 is provided with an opening, and a p-side electrode 28 as the first electrode is formed on the top surface of the ridge 18. The p-side electrode 28 is a stacked film of, for example, a Ni/Au film and a Ti/Pt/Au film.

An n-side electrode 30 as the second electrode is formed in a portion adjacent to the bottom surface of the GaN substrate 10, which includes the bottom surface of the recess 20. The n-side electrode 30 is, for example, a Ti/Pt/Au film.

Here, the total thickness of the GaN substrate 10 and the semiconductor layer is 100 μm or more. That is, the total thickness of the GaN substrate 10, the n-type semiconductor layer 12, the active layer 14 and the p-type semiconductor layer 16 is 100 μm or more. If the total thickness of the GaN substrate 10 and the semiconductor layer is less than 100 μm, the mechanical strength during the manufacturing process cannot be maintained, which would result in difficulties in manufacturing. The distance between the top surface of the ridge 18 and the bottom surface of the recess 20 (first distance: z in FIG. 3A) is 5 μm or more and 50 μM or less.

Figure 4A:
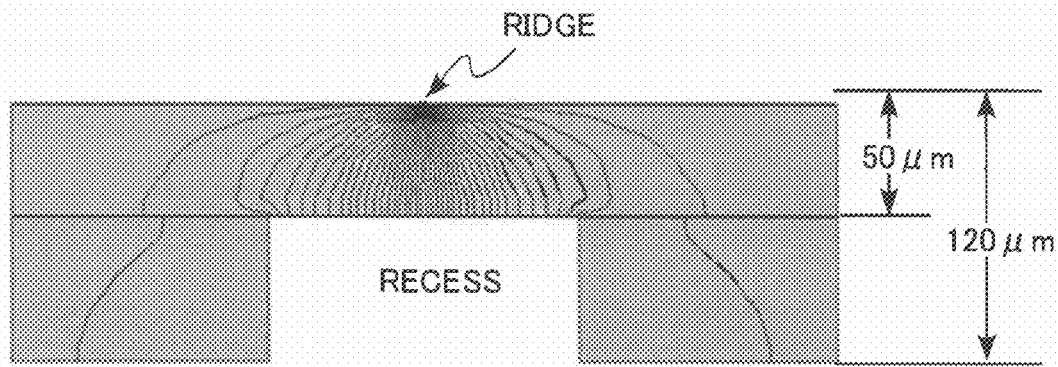
FIGS. 4A and 4B show a voltage reducing effect of the semiconductor laser device of the first embodiment.
Figure 4B:
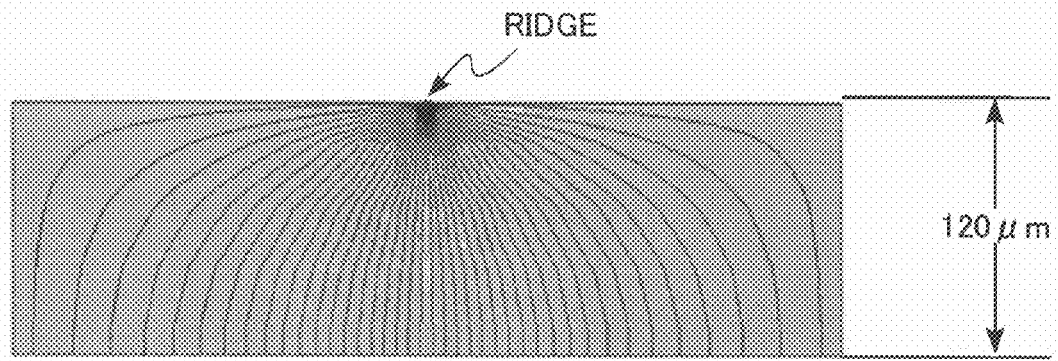

FIGS. 4A and 4B show a voltage reducing effect of the semiconductor laser device of this embodiment. FIG. 4A shows a simulation result of the embodiment, and FIG. 4B shows a simulation result of a conventional structure. From the results of simulations, voltage conditions during the flow of a current of 500 mA are determined. FIGS. 4A and 4B also show current density distributions in cross sections perpendicular to the direction of extension of the ridge.

The total thickness of the GaN substrate 10 and the semiconductor layer is 120 μm in either of the embodiment and the conventional structure. In the embodiment, the distance between the top surface of the ridge 18 and the bottom surface of the recess 20, that is, a distance z in FIGS. 3A and 3B is 50 μm. The ridge width, which is the length in the lateral direction of the ridge, is 5 μm, the ridge height (=the amount of digging) is 0.6 μm, and the width of the bottom surface of the recess is 150 μm.

This embodiment results in a voltage reducing effect of 0.2 V compared to the conventional structure. The reason for this is that the recess 20 is provided, and therefore current flows toward the bottom surface of the recess 20 in a focused way, which results in a shorter current path, rather than toward the bottom surface of the GaN substrate 10.

As such, according to this embodiment, the recess 20 is formed directly under the ridge 18 on which the p-side electrode 28 is provided, and the bottom surface of the recess 20 is provided with the electrode 30, so that the operation voltage is reduced. Accordingly, it is possible to achieve a semiconductor laser device which can be driven at low voltage.

According to the semiconductor laser device of this embodiment, the recess 20 is provided, which allows an n-side electrode 30 having a high thermal conductivity to be formed at a position closer to the active layer 14, which functions as the main heat generation source, than that in the conventional structure. Accordingly, in comparison to the case without the recess 20, thermal dissipation improves. Stable laser operation can thus be expected.

Figure 5:
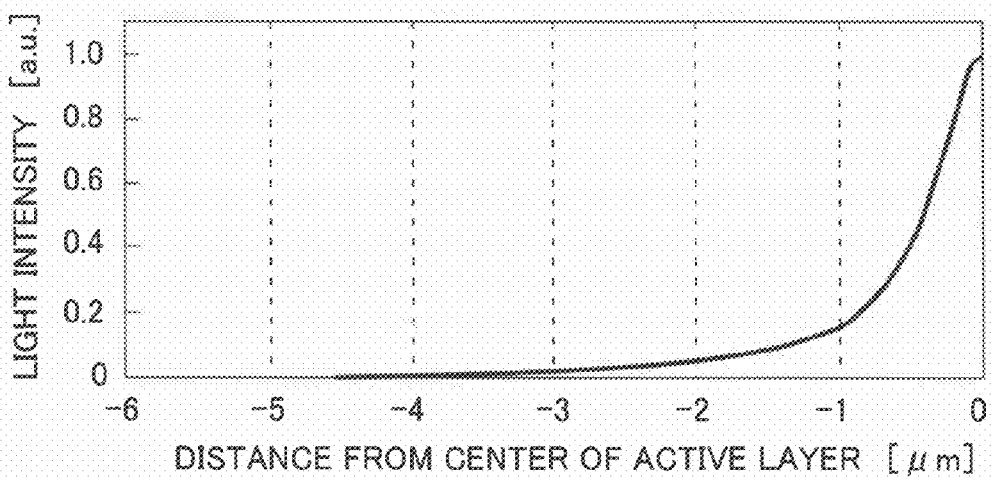
FIG. 5 shows the relationship between the distance from an active layer of the semiconductor laser device of the first embodiment and the light intensity.

FIG. 5 shows the relationship between the distance from the active layer of the semiconductor laser device of this embodiment and the light intensity. The simulation result of the near field pattern (NFP) is represented.

The horizontal axis indicates the distance in the direction perpendicular to the GaN substrate from the central portion of the active layer. The value 0 corresponds to the central portion of the active layer at which the light intensity is strongest, and the negative values represent distances from the active layer 14 toward the GaN substrate. The vertical axis indicates the light intensity.

The light intensity is approximately zero at a point about 4 μm from the central portion of the active layer toward the GaN substrate. Usually, the distance from the top surface of the ridge to the central portion of the active layer is on the order of 1 μm. Therefore, if the distance between the top surface of the ridge 18 and the bottom surface of the recess 20, which is denoted by z in FIGS. 3A and 3B, is less than 5 μm, the presence of the recess 20 adversely affects optical confinement. Accordingly, the distance z between the top surface of the ridge 18 and the bottom surface of the recess 20 needs to be 5 μm or more.

Figure 6:
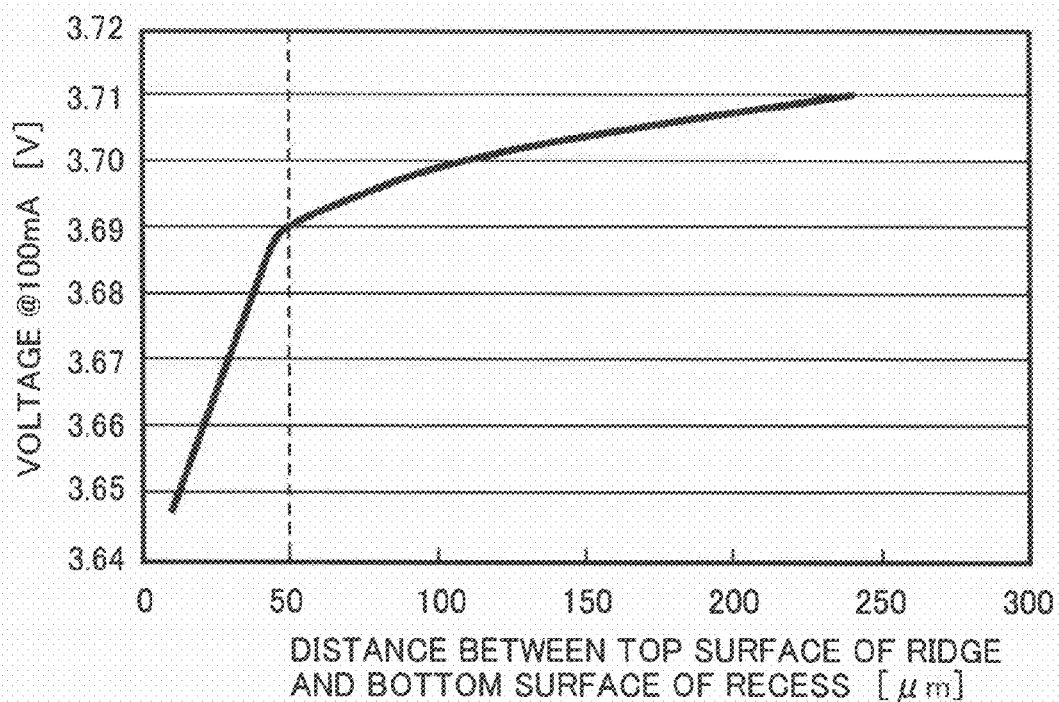
FIG. 6 shows the relationship between the voltage and the distance from the top surface of a ridge to the bottom surface of a recess in the semiconductor laser device of the first embodiment.

FIG. 6 shows the relationship between the voltage and the distance between the top surface of the ridge and the bottom surface of the recess of the semiconductor laser device of this embodiment. This is the result determined through a simulation for the voltage when a current of 100 mA flows while the distance z between the top surface of the ridge and the bottom surface of the recess varies in a structure similar to that in FIG. 4A.

As apparent from FIG. 6, the voltage abruptly drops when the distance z is 50 μm or less. Accordingly, from the viewpoint of sufficiently obtaining the voltage reducing effect due to recess formation, it is desirable that the distance z between the top surface of the ridge and the bottom surface of the recess be 50 μm or less.

FIG. 7 shows the relationships between the voltage and the width of the bottom surface of the recess of the semiconductor laser device of this embodiment. The relationships are the results determined through a simulation for the voltage when a current of 100 mA flows while the width of the bottom surface of the recess, which is denoted by w in FIG. 3A, that is, the width in a direction perpendicular to the direction of extension of the ridge 18 of the bottom surface of the recess 20 varies, in the cases where the distance z between the top surface of the ridge and the bottom surface of the recess is 10 μm and where the distance z is 100 μm, in a structure similar to that in FIG. 4A.

In either of the cases where z is 10 μm and where z is 100 μm, the voltage reducing effect is remarkable in an area where the width w of the bottom surface of the recess is equal to or more than z. Accordingly, it is desirable that the width w in the direction perpendicular to the direction of extension of the ridge 18 of the bottom surface of the recess 20 be equal to or larger than the distance z between the top surface of the ridge and the bottom surface of the recess 20.

Next, a method of manufacturing the semiconductor laser device of this embodiment is described. FIGS. 8A to 12B are cross sections showing processes of the method of manufacturing the semiconductor laser device of this embodiment. FIGS. 8A, 9A, 10A, 11A and 12A are cross-sectional views in a direction corresponding to the line A-A of FIG. 2, and FIGS. 8B, 9B, 10B, 11B and 12B are cross-sectional views in a direction corresponding to the line B-B of FIG. 2.

Figure 8A:
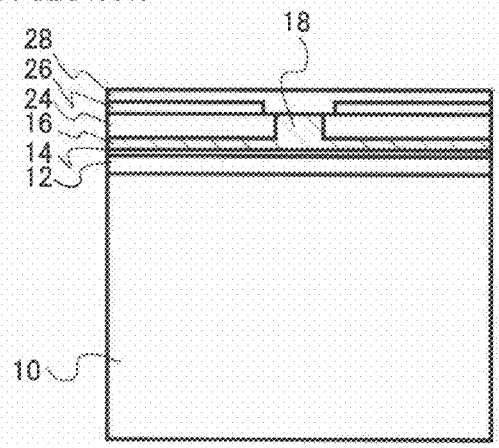
FIGS. 8A and 8B are cross sections showing a process of a method of manufacturing the semiconductor laser device of the first embodiment.
Figure 8B:
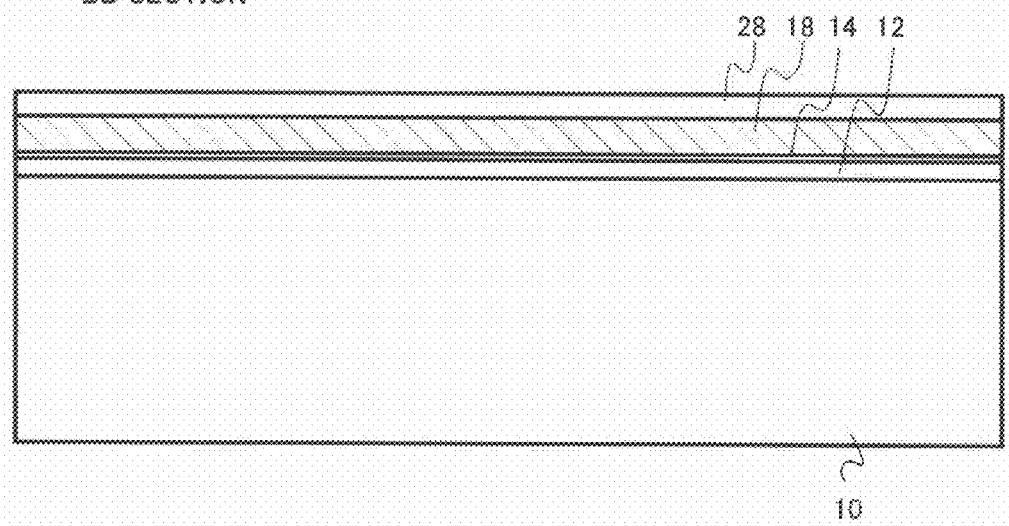

First, as shown in FIGS. 8A and 8B, crystal growth of the n-type semiconductor layer 12, the active layer 14 and the p-type semiconductor layer 16, which are included in the semiconductor layer, in this order on the top surface of a wafer, which is an n-type GaN (0001) substrate 10, by a metal oxide organic chemical vapor deposition (MOCVD) method. The p-type semiconductor layer 16 is dug by etching, for example, dry etching, so that the ridge 18 is formed.

The length of the ridge 18 perpendicular both to the direction of extension of the ridge 18, that is, the direction of the resonator, and to the stacked direction of the semiconductor layer is referred to as a "ridge width". The ridge width is, for example, 5 μm. The amount of etching of the p-type semiconductor layer 16 ranges, for example, from 400 to 2000 nm.

An insulator of a metal oxide, such as $SiO_2$ or $ZrO_2$, is buried in grooves on both sides of the ridge 18 to form the buried layers 24. Thereafter, the protective layer 26, for example, of $SiO_2$ is formed on the buried layers 24.

Then, the protective layer 26 is processed to expose the top surface of the ridge 18, and the p-side electrode 28 is formed, as the first electrode, to come into contact with the top surface of the ridge 18. The p-side electrode 28 is formed by depositing, for example, an Ni/Au film and then forming a Ti/Pt/Au film. A gold plating layer or the like may be formed on the p-side electrode 28. Then, the back surface of the wafer, that is, the bottom surface of the GaN substrate 10 is lapped. That is, the bottom surface of the GaN substrate 10 is ground and polished so that, for example, the total thickness of the GaN substrate 10 and the semiconductor layer is on the order of 120 μm.

Figure 9A:
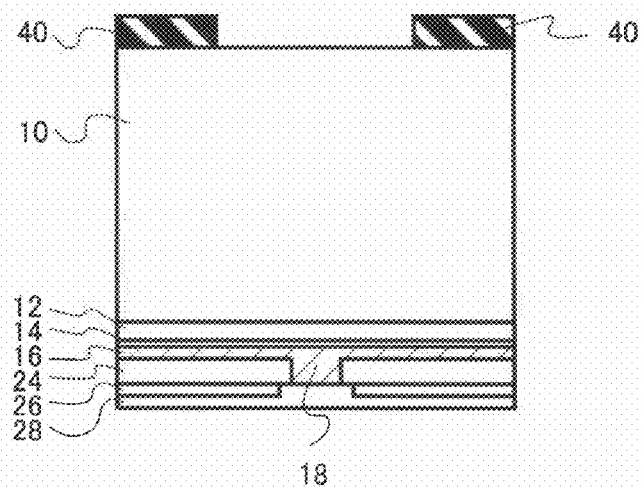
FIGS. 9A and 9B are cross sections showing a process of the method of manufacturing the semiconductor laser device of the first embodiment.
Figure 9B:
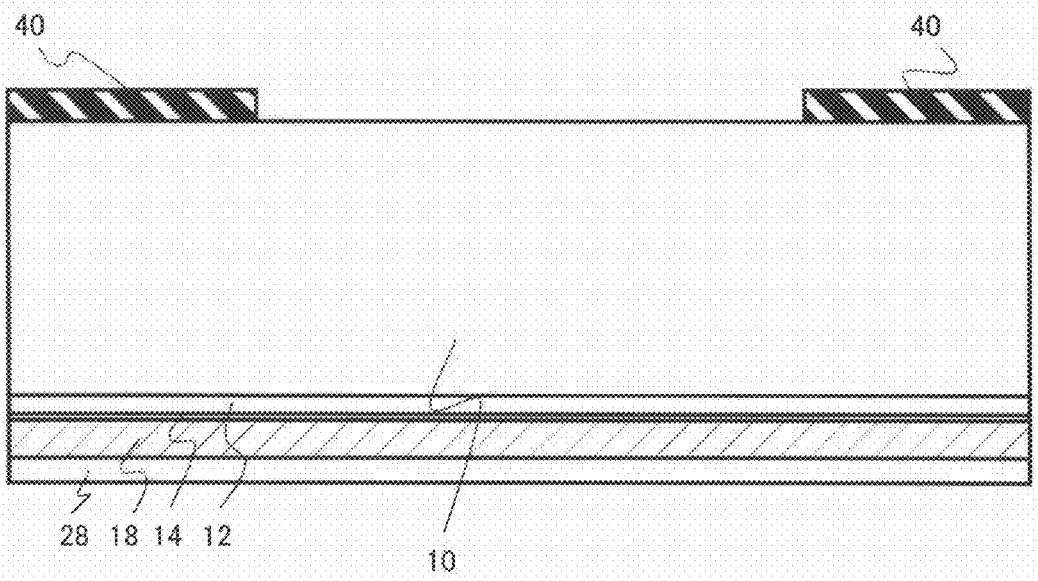

Thereafter, as shown in FIGS. 9A and 9B, an oxide film of $SiO_2$ or the like is formed as a mask member 40 on the back surface of the wafer. Thereafter, the mask member 40 is patterned using a photolithography method, a wet etching method and the like.

Figure 10A:
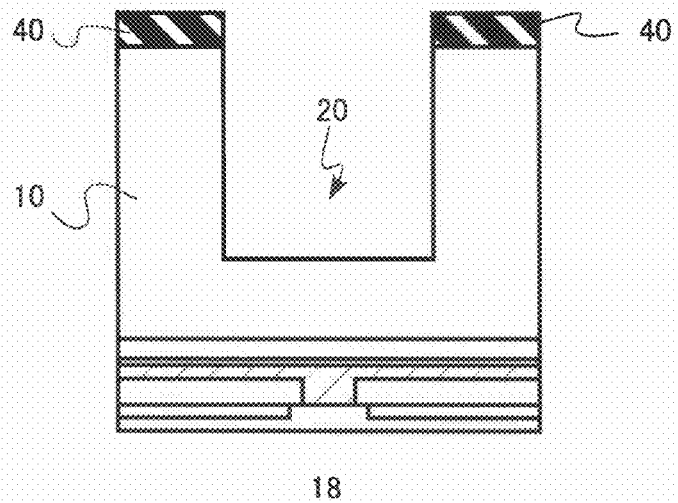
FIGS. 10A and 10B are cross sections showing a process of the method of manufacturing the semiconductor laser device of the first embodiment.
Figure 10B:
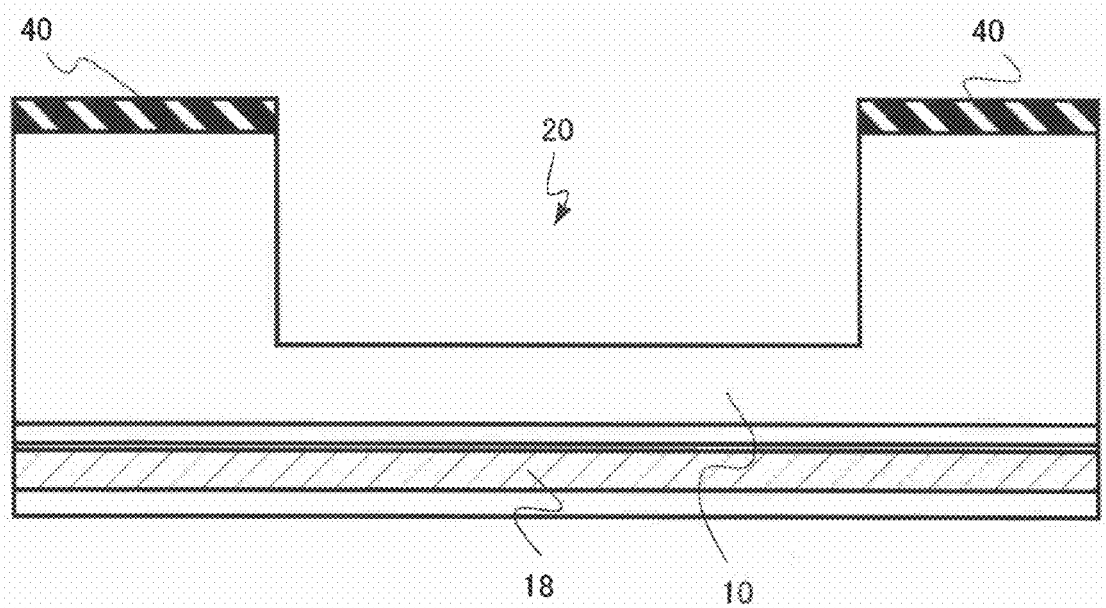

Next, as shown in FIGS. 10A and 10B, with the mask member 40 used as a mask, the bottom surface of the GaN substrate 10 is etched using a dry etching method. The first recess 20 whose thickness is less than that of the GaN substrate 10 is formed directly under the ridge 18.

Figure 11A:
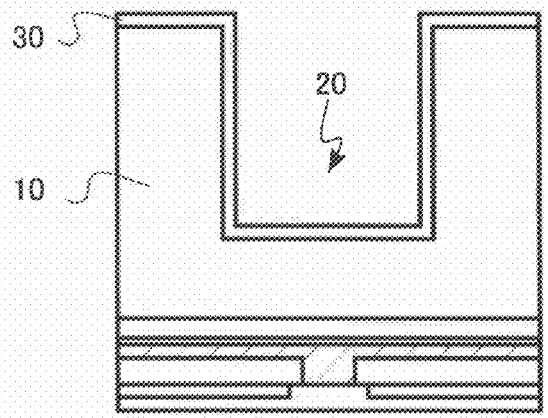
FIGS. 11A and 11B are cross sections showing a process of the method of manufacturing the semiconductor laser device of the first embodiment.
Figure 11B:
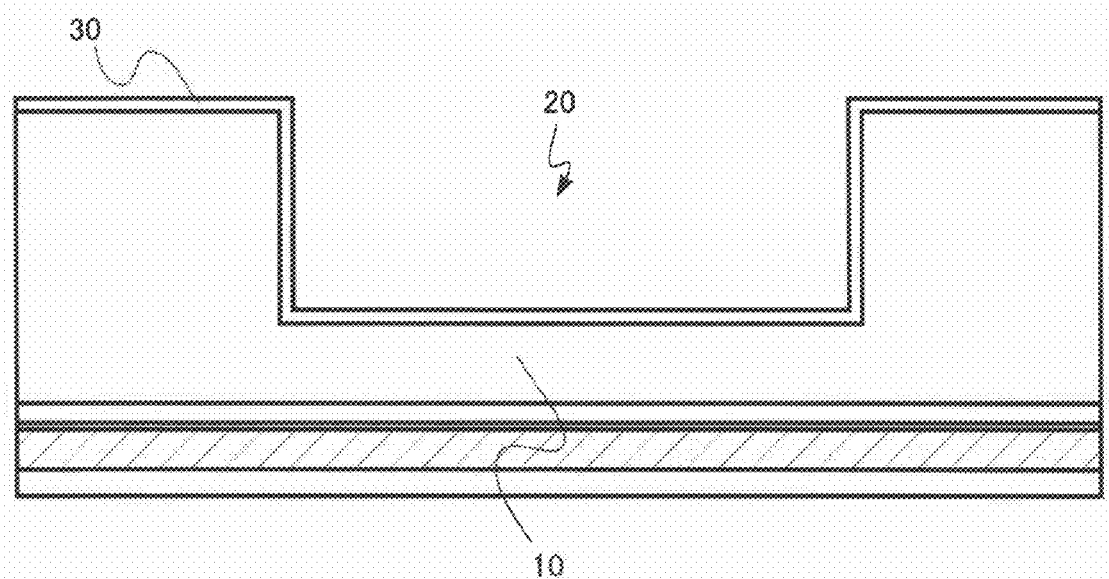

Next, as shown in FIGS. 11A and 11B, after the mask member 40 is removed, for example, a Ti/Pu/Au film is deposited on the bottom surface of the GaN substrate 10 including the bottom surface of the first recess 20 to form the n-side electrode 30.

Figure 12A:
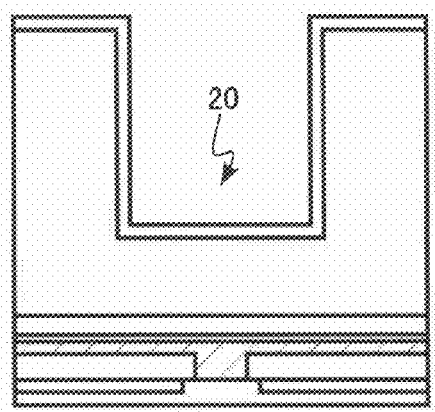
FIGS. 12A and 12B are cross sections showing a process of the method of manufacturing the semiconductor laser device of the first embodiment.
Figure 12B:
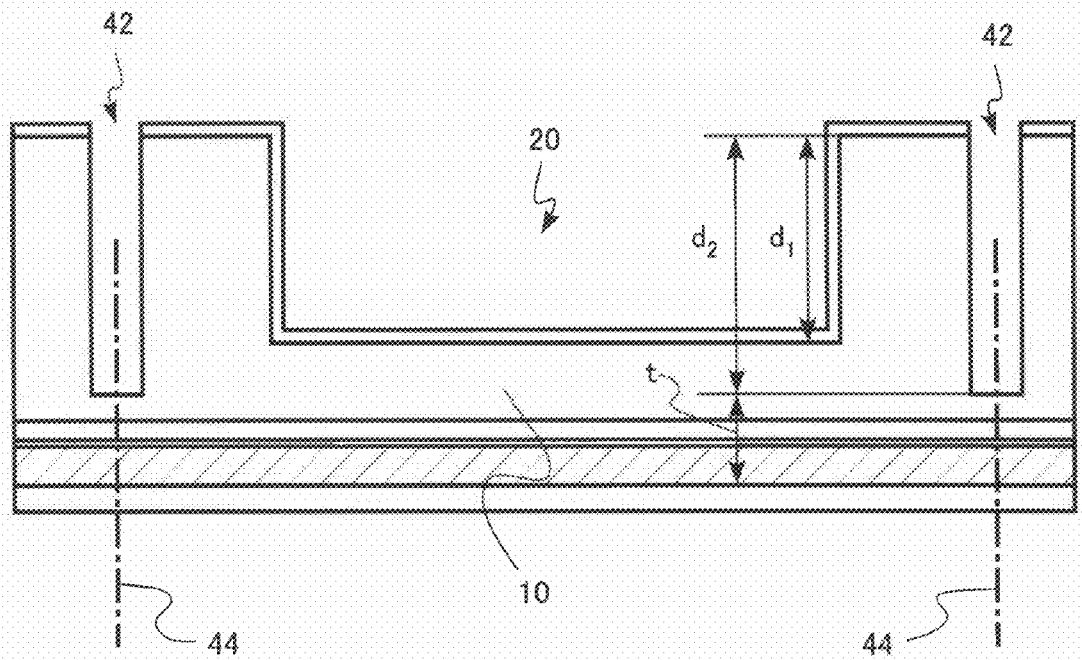

Thereafter, as shown in FIGS. 12A and 12B, second recesses 42, which will be the notches 22 after cleavage, are formed in the bottom surface of the GaN substrate 10, for example, by laser scribing and dicing. The second recesses 42 have a depth $d_2$ greater than the depth $d_1$ of the first recess 20, and are formed in a direction perpendicular to the direction of extension of the ridge 18. The second recesses 42 are formed so as not to intersect with the first recess 20. That is, the second recesses 42 are formed to be separated from the first recess 20 by the GaN substrate 10. Note that the second recesses 42 may be formed using a resist pattern by a photolithography method and dry etching. Thereafter, flaws for cleavage are made by scribing and the like.

Thereafter, the semiconductor layer including the active layer 14 is cleaved. The cleavage starts from the second recesses 42. That is, the wafer is cleaved along predetermined cleavage lines 44 indicated by alternate long and short dash lines in FIG. 12B, so that mirror surfaces of end surfaces of the resonator are formed. The second recesses 42 correspond to the cleavage lines 44.

Figure 13A:
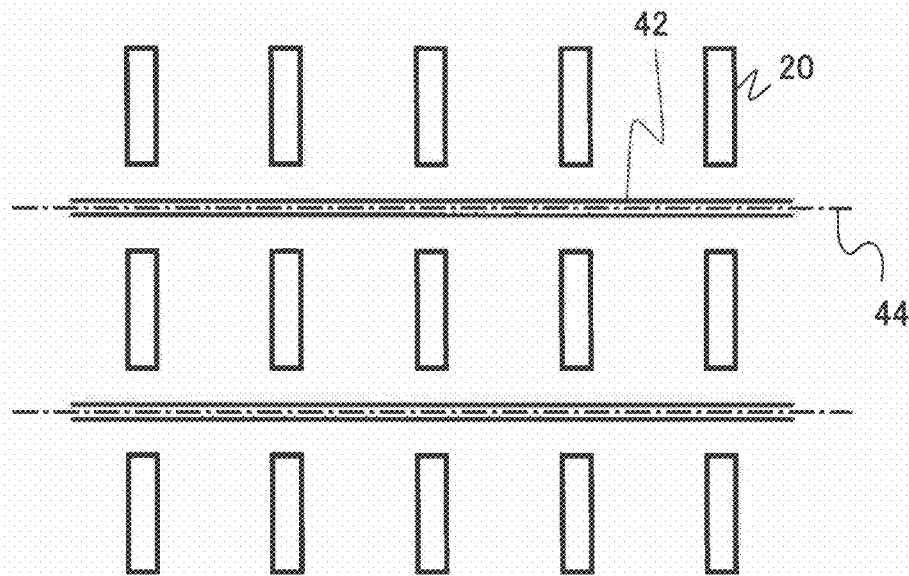
FIGS. 13A and 13B are schematic plan views showing patterns of second recesses of the first embodiment.
Figure 13B:
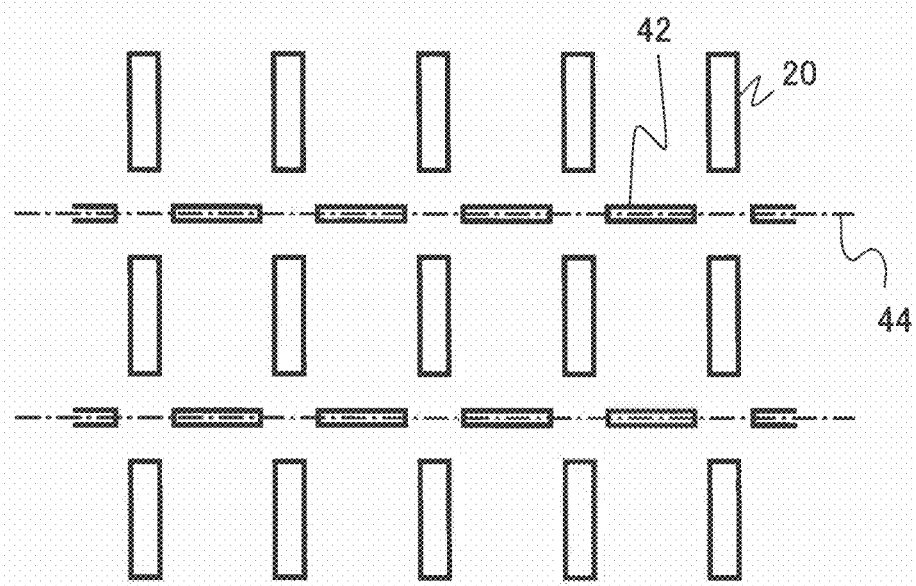

FIGS. 13A and 13B are schematic plan views showing patterns of second recesses of this embodiment. Both FIG. 13A and FIG. 13B show the positional relationship between the second recesses 42 in the back surface of the wafer, that is, the bottom surface of the GaN substrate 10, and the first recesses 20 and the predetermined cleavage lines 44.

As shown in FIG. 13A, the second recesses 42 are formed continuously along the predetermined cleavage lines 44 in directions perpendicular to the first recesses 20 which are formed such that their extension directions are the same as the extension directions of the ridges 18. The second recesses 42 are formed to have the depth $d_2$ greater than the depth $d_1$ of the first recesses 20 and so as not to intersect with the first recesses 20.

Forming the second recesses 42 so as to be deeper than the first recesses 20 and so as not to intersect with the first recesses 20 in this manner makes easy cleavage along the second recesses 42 in the later cleavage process. Consequently, bending and irregularity of the cleavage direction due to the influence of the first recesses 20 are suppressed.

As shown in FIG. 13B, the second recesses 42 may be intermittently formed. The second recesses 42 are not formed in the directions of extension of the first recesses 20 as shown in FIG. 13B. This enables the influence of the second recesses 42 on the formation of mirror surfaces to be reduced particularly in case where the second recesses 42 are formed deep to result in a smaller distance to the active layer 14.

The manufacturing method described above enables formation of the semiconductor laser device shown in FIGS. 1 to 3B. According to the manufacturing method of this embodiment, forming the second recesses 42, which will be the notches 22 later, in addition to the first recesses 20 allows cleavage to be formed with good accuracy. Accordingly, it is enabled to manufacture a semiconductor laser device which can be driven at low voltage and which is excellent for cleavage.

Note that, in the semiconductor laser device of this embodiment, it is more desirable that the distance z between the top surface of the ridge 18 and the bottom surface of the recess 20 (first distance) be larger than 30 μm, and that the distance (a distance t in FIG. 3B and FIG. 12B) between the top surface of the ridge 18 and the bottom of the notch 22 or the second recess 42 (second distance) be 10 μm or more and 30 μm or less.

If the distance z between the top surface of the ridge 18 and the bottom surface of the recess 20 is larger than 30 μm, a sufficient margin can be secured from the above viewpoint of optical confinement. The possibility of damage to the active layer 14 during processing of the recess 20 can be avoided.

If the distance t between the top surface of the ridge 18 and the bottom of the notch 22 or the second recess 42 is less than 10 μm, the mechanical strength before cleavage becomes problematic and has a possibility of causing damage to the active layer 14 during processing of the recess 20. If the distance t is larger than 30 μm, there is a possibility of making it difficult to stably perform cleavage.

Second Embodiment

A semiconductor laser device of this embodiment is the same as the first embodiment except that a metal layer in contact with the notches is further included and that the interface resistance between the notch and the metal layer is higher than that between the bottom surface of the recess and the second electrode. Accordingly, the description which overlaps that of the first embodiment is omitted.

Figure 14A:
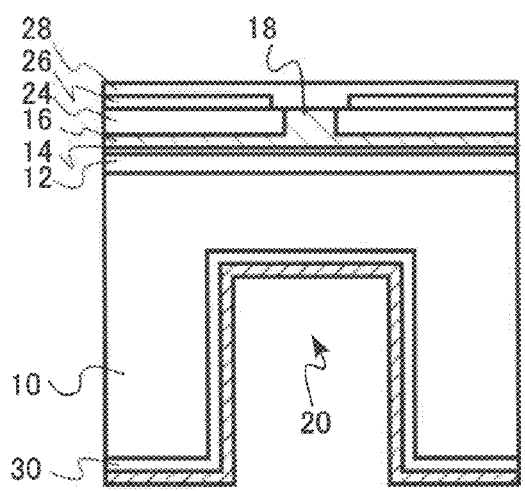
FIGS. 14A and 14B are schematic cross-sectional views of a semiconductor device of a second embodiment.
Figure 14B:
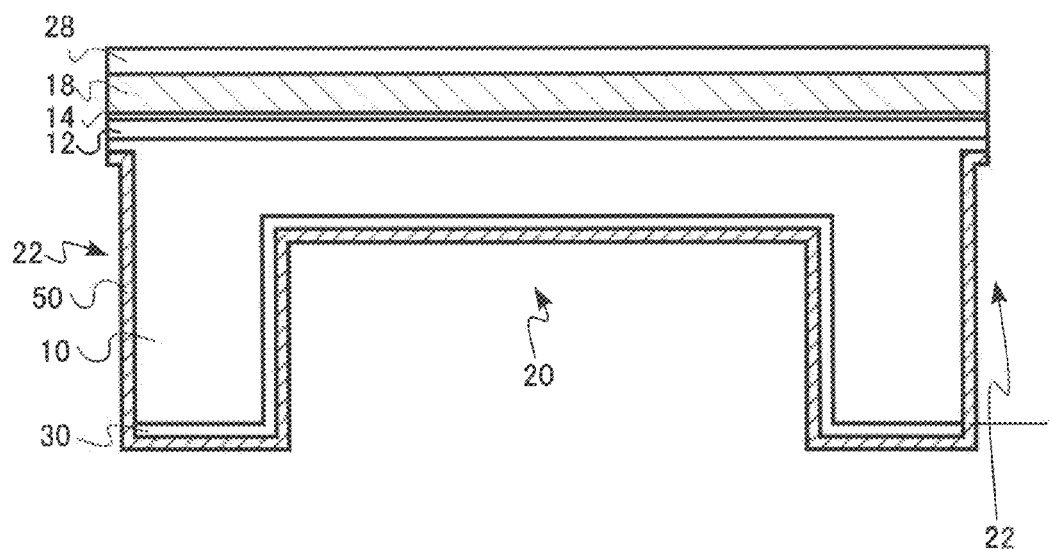

FIGS. 14A and 14B are cross-sectional views of the semiconductor device of this embodiment. FIG. 14A is a cross-sectional view perpendicular to the direction of extension of a ridge, and FIG. 14B is a cross-sectional view in parallel to the direction of extension of the ridge.

As shown in FIG. 14B, a metal layer 50 of, for example, an Au single film is formed in contact with the bottoms and side surfaces of the notches 22. The interface resistance between the metal layer 50 and the GaN substrate 10 in the notch 22 is higher than that between the n-side electrode 30 and the GaN substrate 10.

With the interface resistance between the metal layer 50 and the GaN substrate 10 in the notch 22 higher than that between the n-side electrode 30 and the GaN substrate 10, current flowing toward the metal layer 50, instead of flowing in the direction of the bottom surface of the recess 20, is suppressed.

In this way, the metal layer 50 is provided on the notch 22 near the active layer 14, which functions as the main heat generation source, and particularly near the active layer 14 in an end of the ridge 18 directly under which the recess 20 is not formed. This enables a semiconductor laser device with improved thermal dissipation more than that in the first embodiment to be achieved in addition to the first embodiment.

Note that, in the manufacturing method described in the first embodiment, it is possible to form the Au film on the second recesses 42 after the formation of the second recesses 42 and before cleavage, for example, by an evaporation method and then performing cleavage to form the semiconductor laser device in a structure shown in FIGS. 14A and 14B.

While certain embodiments have been described, these embodiments have been presented by way of example only, and are not intended to limit the scope of the inventions. Indeed, the semiconductor laser diode described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

For example, while the case where the recess 20, the notch 22 and the second recess 42 have their side surfaces perpendicular to the bottom surface of the GaN substrate 10 has been described, they may have, for example, tapered shapes with respect to the bottom surface of the GaN substrate 10. For example, a normally tapered shape enables the improved coverage of an n-side electrode and the like, which are formed after the formation of recesses, by the metal film.

While the example of $SiO_2$ or $ZrO_2$ as the insulator for burying the buried layer has been described, $Al_2O_3$, $TaO_2$ and $HfO_2$, which are other metal oxides, are also preferable.

While the MOCVD method has been used as the film formation method, other film formation methods, for example, a molecular beam epitaxy (MBE) method, may be used. It would be reasonable that the combinations, compositions and thicknesses of individual semiconductor layers are changed as design matters in accordance with applications of the semiconductor laser. Likewise, the depth of the ridge layer, what is the deepest layer to be dug, and the like are adjustable as design matters unless they depart from the scope and spirit of the invention.

In the manufacturing method, the example of forming the first recess and second recess are formed independently of each other has been described. However, for example, a method of forming the second recess in partway at the same time as the first recess may be adopted.

What is claimed is:

1. A semiconductor laser device comprising:
   a GaN substrate;
   a semiconductor layer formed on a top surface of the GaN substrate;
   a ridge formed at a top of the semiconductor layer;
   a recess formed in a bottom surface of the GaN substrate, the recess having a depth less than a thickness of the GaN substrate, and the recess being formed directly under the ridge;
   a notch formed on a side surface of the GaN substrate intersecting with a direction of extension of the ridge and being separated from the recess by the GaN substrate, the notch being deeper than the recess;
   a first electrode formed on a top surface of the ridge; and
   a second electrode formed on a bottom surface of the recess, wherein a total thickness of the GaN substrate and the semiconductor layer is 100 μm or more, and
   a first distance is 5 μm or more and 50 μm or less, the first distance is a distance between the top surface of the ridge and the bottom surface of the recess,
   wherein the bottom surface of the recess has a width in a direction perpendicular to the direction of extension of the ridge equal to or larger than the first distance.

2. The device according to claim 1, wherein the first distance is larger than 30 μm, and a second distance is 10 μm or more and 30 μm or less, the second distance is a distance between the top surface of the ridge and a bottom of the notch.

3. The device according to claim 1, further comprising a metal layer in contact with the notch,
   wherein an interface resistance between the notch and the metal layer is higher than an interface resistance between the bottom surface of the recess and the second electrode.

4. A method of manufacturing a semiconductor laser device, comprising:
   forming a semiconductor layer on a top surface of a GaN substrate;
   forming a ridge at a top of the semiconductor layer;
   forming a first electrode on a top surface of the ridge;
   lapping a bottom surface of the GaN substrate;
   forming a first recess in the bottom surface of the GaN substrate, the first recess having a depth less than a thickness of the GaN substrate, the first recess being formed directly under the ridge and the bottom surface of the first recess has a width in a direction perpendicular to the direction of extension of the ridge equal to or larger than a distance between the top surface of the ridge and a bottom surface of the recess;
   forming a second electrode on the first recess;
   forming a second recess in a direction perpendicular to a direction of extension of the ridge on the bottom surface of the GaN substrate, the second recess being deeper than the first recess and not intersecting with the first recess; and
   cleaving the semiconductor layer with the second recess as a cleaving line.

5. The method according to claim 4, wherein
   a total thickness of the GaN substrate and the semiconductor layer after the lapping is 100 μm or more, and
   a first distance is 5 μm or more and 50 μm or less, the first distance is a distance between the top surface of the ridge and a bottom surface of the first recess.

6. The method according to claim 4, wherein
   the first distance is larger than 30 μm, and
   a second distance is 10 μm or more and 30 μm or less, the second distance is a distance between the top surface of the ridge and a bottom of the second recess.

7. The method according to claim 4, further comprising forming a metal layer in contact with the second recess before cleaving the semiconductor layer,
   wherein an interface resistance between the second recess and the metal layer is higher than an interface resistance between the bottom surface of the first recess and the second electrode.

8. A semiconductor device comprising:
   a substrate;
   a semiconductor layer formed on a top surface of the substrate;
   a ridge formed at a top of the semiconductor layer;
   a recess formed in a bottom surface of the substrate, the recess having a depth less than a thickness of the substrate, the recess being formed directly under the ridge;
   a notch formed on a side surface of the substrate intersecting with a direction of extension of the ridge and being separated from the recess by the substrate, the notch being deeper than the recess;
   a first electrode formed on a top surface of the ridge; and
   a second electrode formed on a bottom surface of the recess, wherein
   a total thickness of the substrate and the semiconductor layer is 100 μm or more, and
   a first distance is 5 μm or more and 50 μm or less, the first distance is a distance between the top surface of the ridge and the bottom surface of the recess,
   wherein the bottom surface of the recess has a width in a direction perpendicular to the direction of extension of the ridge equal to or larger than the first distance.

* * * * *